United States Patent [19]
Kurogi et al.

[11] Patent Number: 5,578,874
[45] Date of Patent: Nov. 26, 1996

[54] HERMETICALLY SELF-SEALING FLIP CHIP

[75] Inventors: Garrett I. Kurogi, Lakewood; Matthew J. Swass, El Segundo, both of Calif.

[73] Assignee: Hughes Aircraft Company, Los Angeles, Calif.

[21] Appl. No.: 260,056

[22] Filed: Jun. 14, 1994

[51] Int. Cl.$^6$ .................................................. H01L 23/48
[52] U.S. Cl. ............................................. 257/778; 257/779
[58] Field of Search ..................................... 257/676, 778, 257/698, 684, 779, 786

[56] References Cited

U.S. PATENT DOCUMENTS 3,657,610  4/1972  Yamamoto et al. ..................... 257/778
5,281,151  1/1994  Arima et al. ............................ 257/778

FOREIGN PATENT DOCUMENTS 522461  1/1993  European Pat. Off. .

*Primary Examiner*—Mahshid Saadat
*Assistant Examiner*—Roy Potter
*Attorney, Agent, or Firm*—Leonard A. Alkov; Wanda K. Denson-Low

[57] ABSTRACT

A package containing an integrated circuit has all of its I/O contacts on one of the package faces. The periphery of that face is processed to be wettable with solder. The substrate to which the package is to be attached has corresponding contacts and has a solder wettable ring comparable to the ring at the periphery at the package face. When the package is positioned on the substrate it is hermetically sealed therearound by soldering the two rings together, such as by reflow soldering.

8 Claims, 2 Drawing Sheets

HERMETICALLY SELF-SEALING FLIP CHIP

FIELD OF THE INVENTION

This invention is directed to the attachment of a flip chip to a substrate and hermetically sealing the periphery of the flip chip to the substrate by soldering.

BACKGROUND OF THE INVENTION

Flip chips are packages containing integrated circuits and are typically composed of a semiconductor dip. The I/O contacts of the circuit are the input and output contact points for the circuit and are brought out to one face of the package. A substrate has contact bumps thereon which correspond to the I/O contact points on the package. The package is placed face down on one substrate with the contacts in corresponding position. When in position, the contacts are attached, as by reflow soldering. This type of flip chip attachment is convenient and reliable. The problem arises from the possibility that contaminants can get between the integrated circuit package and the substrate. Such contaminants could reduce the reliability of the circuitry. As a result of that possibility of contamination, flip chip integrated circuits on substrates are usually housed for protection. Housing, in turn, adds costs, increases the package size, and reduces the heat dissipation.

At present, some integrated circuits on substrates are protected from the environment by encapsulating them in synthetic polymer composition material or some other organic material. This is not suitable for radio-frequency circuits. Another way of protecting integrated circuits is to place them in a hermetically sealed container made of metal and/or ceramic. This method involves many additional parts and process steps. It adds weight, takes up space, and reduces heat emission.

SUMMARY OF THE INVENTION

In order to aid in the understanding of this invention, it can be stated in essentially summary form that it is directed to a hermetically self-sealing flip chip wherein the I/O face of the flip chip and the corresponding face of the substrate have seal surfaces which surround the I/O contacts. When the chip is secured to the substrate, the I/O contacts are connected and a seal ring is completed therearound.

It is, thus, a purpose and advantage of this invention to provide a flip chip which is hermetically sealed against the face of its substrate around the I/O contacts therebetween so as to protect the contact area from contamination.

It is another purpose and advantage of this invention to provide a seal which automatically accomplishes sealing at the same time the I/O contacts are made.

It is a further purpose and advantage of this invention to eliminate the need for a separate housing by hermetically sealing away the I/O contacts between the flip chip and its substrate.

It is a further purpose and advantage of this invention to reduce the cost of a module which incorporates a flip chip by eliminating the need for a separate sealing step.

It is a further purpose and advantage of this invention to permit heat dissipating material and/or fluid to achieve direct contact with the flip chip to enhance cooling while, at the same time, protecting the I/O contacts from the coolant.

It is a further purpose and advantage of this invention to prevent contaminants from getting under the flip chip to the region of the I/O contacts, to thus enhance reliability.

It is another purpose and advantage of this invention to reduce overall package size by eliminating a separate exterior package which would enclose the I/O contact area.

Other purposes and advantages of this invention will become apparent from a study of the following portion of the specification, the claims and the attached drawings wherein:

DESCRIPTION OF THE PREFERRED EMBODIMENT

Figures 1, 2:
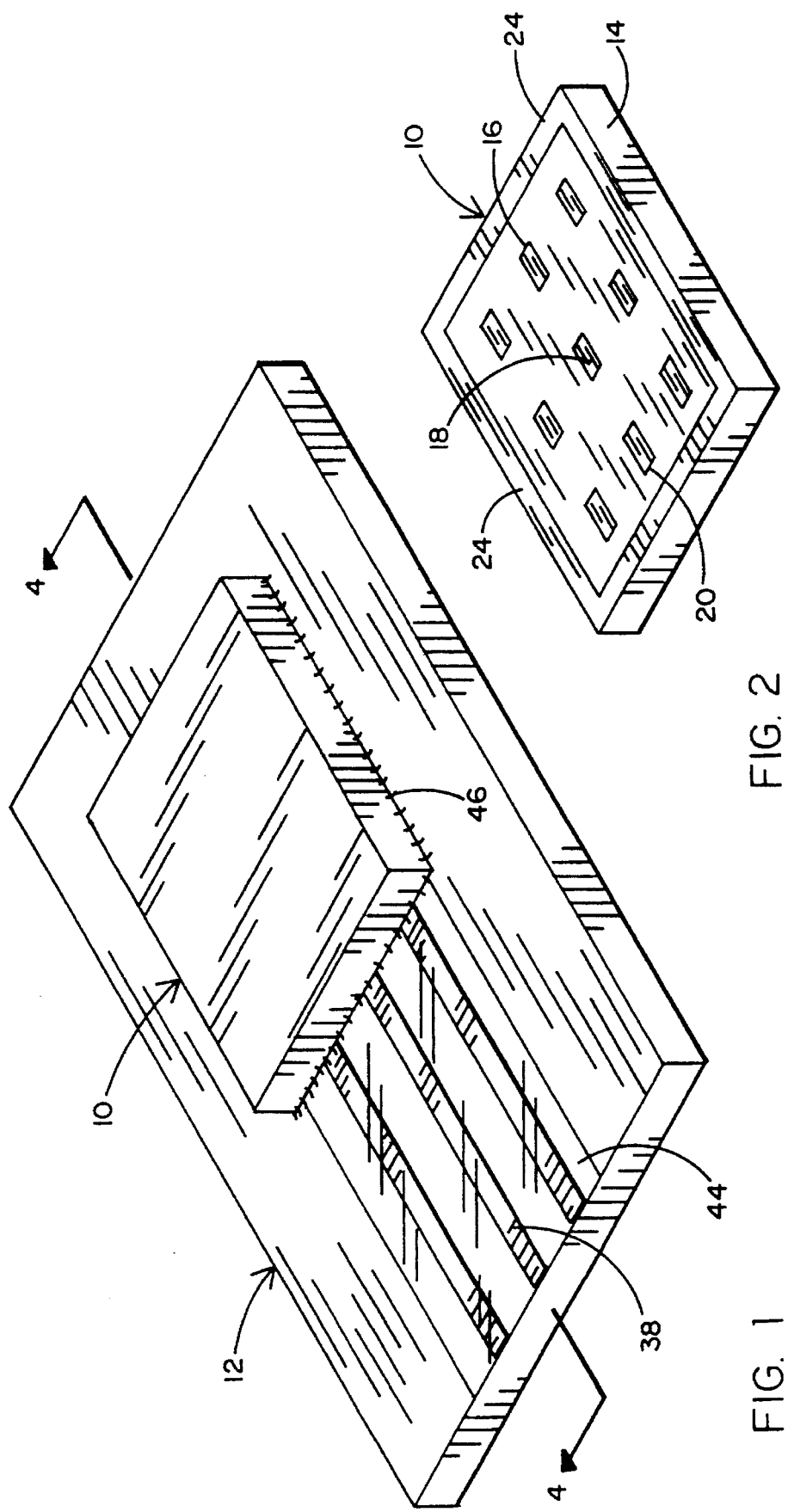
FIG. 1 is an isometric view of a substrate carrying a flip chip thereon sealed with respect thereto.
FIG. 2 is an isometric view of the underside of the flip chip before it is attached.
Figures 3, 4:
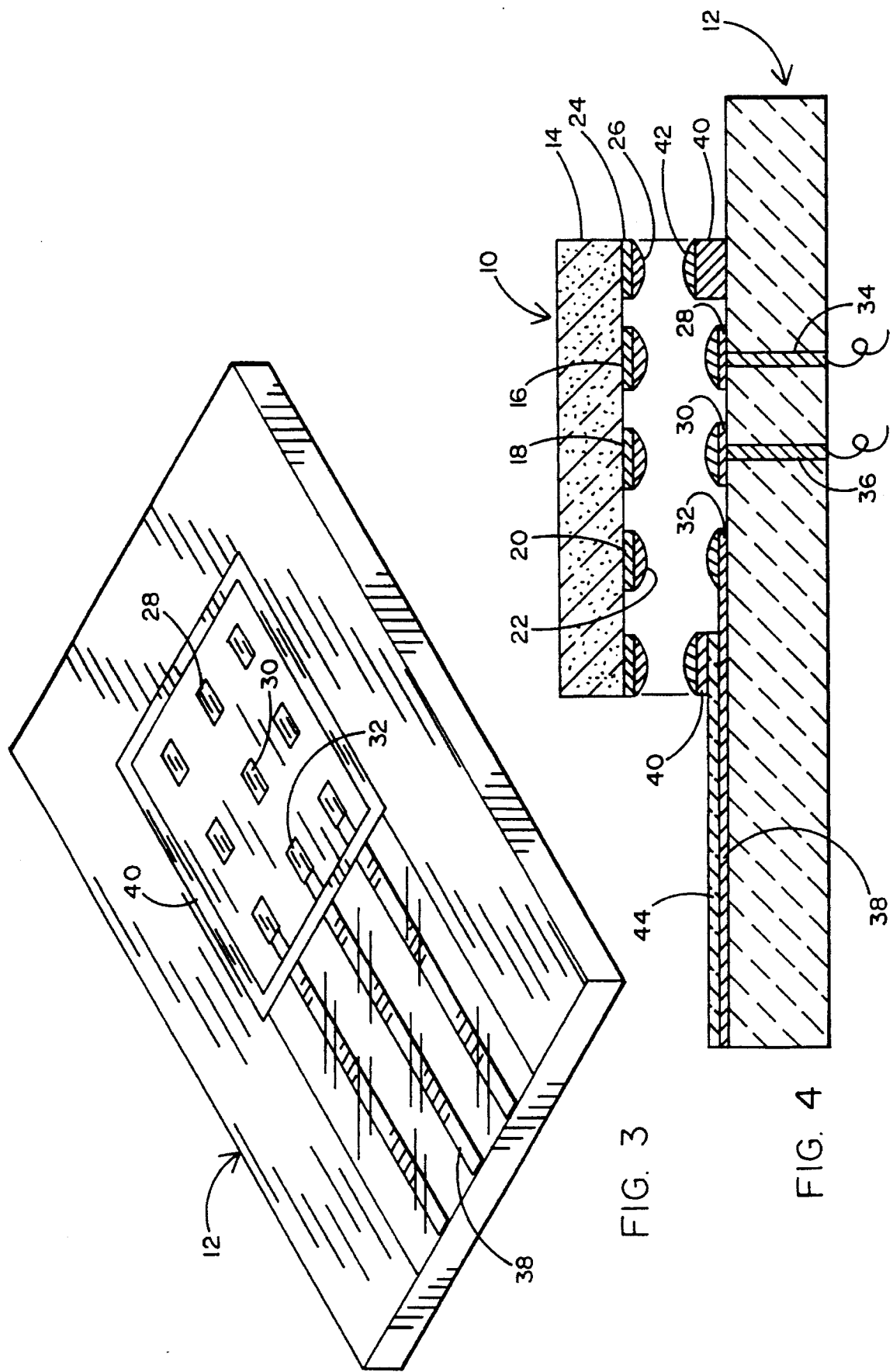
FIG. 3 is an isometric view of the substrate before the flip chip is attached thereto.
FIG. 4 is a longitudinal section through the substrate and flip chip, showing the flip chip being brought down into the sealing position.

A flip chip is indicated at 10 in FIGS. 1, 2 and 4, and its corresponding substrate is generally indicated at 12 in FIGS. 1, 3 and 4. The flip chip 10 houses or contains an integrated circuit which is housed in the body 14. The body may be of semiconducting, ceramic or synthetic polymer dielectric material. In order to make contact with the integrated circuitry within the body, a plurality of contacts are provided on the undersurface of the body. Contacts 16, 18 and 20 are specifically identified in FIG. 2 and represent three of what may be a considerably larger number of contacts. These contacts form the input and output signals and power supplies to the integrated circuit in the flip chip. These are often called "I/O contacts." Conventionally, they are formed as a platable material, such as copper or gold. In FIG. 3, they are indicated as having a solder bump thereon for reflow soldering. For example, solder bump 22 is shown in FIG. 4 as deposited on contact 20. Each of the other contacts has a similar solder bump.

In addition to the I/O contacts, the contact side of the body 14 has a surrounding barrier 24, which is seen in FIG. 4 as having a solder bump 26 thereon. The surrounding barrier 24 is preferably at the edge of the body 14. Since the body 14 in the present example is rectangular, the surrounding barrier 24 is also rectangular. It is preferably at the edge of the body to prevent a small space from occurring beneath the body of the flip chip, as is described below. The surrounding barrier must surround all of the I/O contacts to be effective.

The substrate 12 has a plurality of contacts thereon corresponding to the contacts on the underside of the flip chip. Contacts 28, 30 and 32 are specifically identified, and these correspond to the contacts 16, 18 and 20, respectively, as is seen in FIG. 4. The contacts are mounted on dielectric substrate 12, which may be ceramic or synthetic polymer material. The contacts can be solder-coated copper pads or may be spring contacts. In order to permit external electrical connection of the contacts, vias through the substrate and/or printed wiring on the substrate allow such connection. As seen in FIG. 4, vias 34 and 36 respectively permit connection from contacts 28 and 30 through the substrate. Contact 32 is connected by printed wiring 38 on the upper surface of the substrate away from the mounting point of the flip chip 10.

In order to seal the flip chip down on the substrate, a corresponding surrounding barrier 40 is positioned around the substrate corresponding to the position of barrier 24 when the flip chip is properly positioned on the substrate. Barrier 40 carries a solder bump 42 which corresponds to solder bump 26. As is seen in FIGS. 1 and 3, printed wiring extends out from underneath the flip chip for connection to other circuits. In order to prevent short circuiting of the printed wiring of which line 38 is an example, the printed wiring is covered with an insulating layer 44 before the deposition of the barrier 40. The insulating layer 44 may be a glass layer or the like and provides the necessary dielectric separation between the printed wiring 38 and the barrier 40.

In assembly, the parts are cleaned in the conventional ways, and the flip chip is positioned on the substrate with the barriers in line. In FIG. 4, the flip chip is brought straight down so that its outer bumps are in contact. The assembly is heated, and the solder reflows to electrically connect the contacts between the flip chip and the substrate. At the same time, the solder reflows on the barriers to completely enclose the I/O contacts. A solder fillet 46, see FIG. 1, is formed all the way around the periphery of the flip chip to hermetically seal the contacts between the flip chip and the substrate. FIG. 4 implies that the height of the barrier is greater than the height of the contacts. In actuality, the printed wiring 38 and glass layer 44 are very thin so that there is no real significant difference in height. Any difference in height is readily accommodated by the reflow of solder. For those substrates where all of the connections to the flip chip can be made by means of vias, then the printed wiring on the surface (such as printed wiring 38) and the insulator layer 44 are unnecessary. In that case, the surrounding seal does not have to extend over printed wiring connectors. The surrounding barrier can be a simple etching-on-copper-foil procedure, an electroless deposition onto the substrate, or some other convenient procedure for building up a solderable layer.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A hermetically sealed flip chip structure comprising:
   a dielectric substrate (12) having a face and having solder-coated contacts (28, 30, 32) mounted on said face thereof and with at least one of said contacts (28, 30) having corresponding vias (34, 36) through said substrate (12) for connection to said at least one of said contacts (28, 30);
   a barrier (40) surrounding said surface contacts (28, 30, 32) on said substrate (12) said barrier (40) having a contact (42) thereon;
   an integrated circuit-containing body (14), a face on said body (14), integrated circuit contacts (16, 18, 20) on said face of said body (14), said integrated circuit contacts (16, 18, 20) on said face of said body (14) corresponding in position to said contacts (28, 30, 32) on said substrate, a barrier (24) on said face of said body (14), said barrier (24) surrounding said contacts (16, 18, 20) on said face of said body (14), said barrier (24) having a contact (26) thereon, said barrier (24) on said body (14) corresponding to said barrier (40) on said substrate (12) so that when said contacts (16, 18, 20) on said body (14) are against said contacts (28, 30, 32) on said substrate (12), said barriers (24, 40) lie against each other, said barriers (24, 40) being sealed together so as to hermetically seal said contacts (16, 18, 20; 28, 30, 32,) between said body (14) and said substrate (12), and said contact (42) on said barrier (40) corresponding to said contact (26) on said barrier (24),
   wherein there is at least one printed wiring strip (38) on the surface of said dielectric substrate (12) and there is an insulator layer (44) over said printed wiring strip (38), said surrounding barrier (40) on said substrate (12) being positioned over said insulating layer (44) so that said surrounding barrier (40) is electrically isolated from said printed wiring strip (38).

2. The flip chip structure of claim 1 wherein said barrier on said body is formed as a metallic layer on said face of said body and a solder bump on said metallic layer.

3. The chip structure of claim 2 wherein said barrier on said substrate comprises a metallic barrier on said face of said substrate and a solder bump on said metallic barrier on said substrate.

4. The chip structure of claim 3 wherein said solder bumps are fused together to provide said hermetic seal surrounding said contacts.

5. The chip structure of claim 4 wherein said surrounding barrier is at the periphery of said body so that a visible fillet is positioned between said body and said substrate.

6. The chip structure of claim 5 wherein there is at least one printed wiring strip on the surface of said substrate and there is an insulator layer over said printed wiring strip, said surrounding barrier on said substrate being positioned over said insulating layer so that said surrounding barrier is electrically isolated from said printed wiring strip.

7. The chip structure of claim 1 wherein said barrier on said substrate comprises a metallic barrier on said face of said substrate and a solder bump on said metallic barrier on said substrate.

8. The chip structure of claim 7 wherein there is at least one printed wiring strip on the surface of said substrate and there is an insulator layer over said printed wiring strip, said surrounding barrier on said substrate being positioned over said insulating layer so that said surrounding barrier is electrically isolated from said printed wiring strip.

* * * * *